United States Patent
Warren

[19]

[11] Patent Number: 5,951,813
[45] Date of Patent: Sep. 14, 1999

[54] TOP OF DIE CHIP-ON-BOARD ENCAPSULATION

[75] Inventor: Robert W. Warren, Laguna Hills, Calif.

[73] Assignee: Raytheon Company, Lexington, Mass.

[21] Appl. No.: 08/643,036

[22] Filed: May 2, 1996

[51] Int. Cl.$^6$ .................................................. B29C 41/34
[52] U.S. Cl. ..................................... 156/305; 264/272.11
[58] Field of Search ....................... 264/272.11; 156/305

[56] References Cited

U.S. PATENT DOCUMENTS

| | | | |
|---|---|---|---|
| 4,390,596 | 6/1983 | Laurent | 264/272.11 X |
| 5,173,766 | 12/1992 | Long et al. | 257/687 |
| 5,182,853 | 2/1993 | Kobayashi et al. | 29/841 |
| 5,304,512 | 4/1994 | Arai et al. | 264/272.11 X |
| 5,313,365 | 5/1994 | Pennisi et al. | 361/760 |
| 5,318,926 | 6/1994 | Dlugokecki | 29/827 |
| 5,457,878 | 10/1995 | Rostoker et al. | 29/840 |
| 5,535,101 | 7/1996 | Miles et al. | 367/808 |
| 5,596,172 | 1/1997 | Raskin et al. | 174/52.4 |

*Primary Examiner*—Francis J. Lorin
*Attorney, Agent, or Firm*—Leonard A. Alkov; Glenn H. Lenzen, Jr.

[57] ABSTRACT

A processing method that encapsulates the top of a chip-on-board module in a manner that permits rework of the module or removal of integrated circuits used therein. The method comprises the steps of providing a chip-on-board module having a substrate and an integrated circuit disposed thereon, applying a first encapsulant material to a top surface of the a chip-on-board module to cover the integrated circuit except for wire bond spans and wire bonds on the substrate, and applying a second encapsulant material to the wire bond spans and wire bonds on the substrate. The first encapsulant material may be epoxy or polyimide, while the second encapsulant material comprises may be parylene or silicon nitride, for example. The second encapsulant material may be readily removed by cleaning the module with oxygen plasma etching, for example, which does not affect the underlying first encapsulant material, and is removed without damaging the integrated circuit or circuits of the module.

5 Claims, 1 Drawing Sheet

TOP OF DIE CHIP-ON-BOARD ENCAPSULATION

BACKGROUND

The present invention relates generally to chip-on-board module processing methods, and more particularly, to a top of die processing method that provides encapsulation on the top of a chip-on-board module in a manner that permits rework of the module and removal of integrated circuits used therein.

Encapsulation of wire bonded integrated circuits, commonly referred to as a "glob top" method for encapsulating chip-on-board modules, has been practiced in the electronics industry (primarily commercial) for many years to provide a form of environmental and mechanical protection for hybrids and multichip modules. Epoxy has proven to be a very effective barrier to moisture induced corrosion and damage resulting from physical handling. In the conventional glob top method, epoxy, or a similarly effective encapsulant, such as polyimide, for example, has traditionally been dispensed over the entire integrated circuit and over every portion of the wires that connect it to an underlying substrate.

However the integrated circuits that are encapsulated using the conventional glob top method are difficult or impossible to remove and replace. A typical glob topped die is not reworkable because epoxy is almost impossible to remove without ruining the underlying substrate and/or wire bond pads. The benefit of rework is especially important for today's multichip modules which are relatively expensive due to the complexity and cost of the integrated circuits and the substrate.

The present invention is similar to methods sometimes used in the electronics industry for tape automated bonding processes. Tape automated bonded devices are sometimes encapsulated on the surface of the device (including inner lead bonds) with epoxy or polyimide to provide environmental and mechanical protection, in addition to providing enhanced strength of the inner lead bonds. However, the approach provided by the present invention is not believed to have been used for wire bonded devices.

Accordingly, it is an objective of the present invention to provide for an improved top of die processing method that provides encapsulation on the top of a chip-on-board module in a manner that permits rework of the module and removal of integrated circuits used therein.

SUMMARY OF THE INVENTION

To meet the above and other objectives, the present invention is a processing method that encapsulates the top of a chip-on-board module in a manner that permits rework of the module or removal of integrated circuits used therein. The present method comprises the steps of providing a chip-on-board module having a substrate and an integrated circuit disposed thereon, applying a first encapsulant material to a top surface of the integrated circuit and wire bonds on the integrated circuit except for wire bond span and wire bonds on the substrate, and applying a second encapsulant material to the wire bond span and bond connections on the substrate.

The present invention provides a form of protection that is an alternative and less expensive way to protect the integrated circuit than using a hermetic package enclosure. While epoxy has proven to be a very effective barrier to moisture induced corrosion and damage resulting from physical handling, it cannot be easily removed from fully encapsulated modules. Consequently, the present invention provides for an encapsulation approach that applies epoxy or similar encapsulant, such as polyimide, only to the most corrosion susceptible areas of a hybrid or multichip module. The method covers the top of the integrated circuit (including wire bonds on the integrated circuit) with encapsulant material, but the encapsulant material is not applied to the wire spans or to wire bond connections on the substrate, as it normally is with traditional glob top encapsulation methods. The areas not covered by the encapsulant material (typically gold wires and gold substrate traces) are coated with a more easily removed protectant or encapsulant material, such as parylene or silicon nitride, for example.

The major benefit of the present invention is that it allows the integrated circuits to be removed and replaced, unlike the typical glob top approach. A typical glob topped die is not reworkable because epoxy is almost impossible to remove without ruining the underlying substrate and/or wire bond pads. The ability to rework modules is especially important for today's multichip modules which are relatively expensive due to the complexity and cost of the integrated circuits and substrate.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 1:
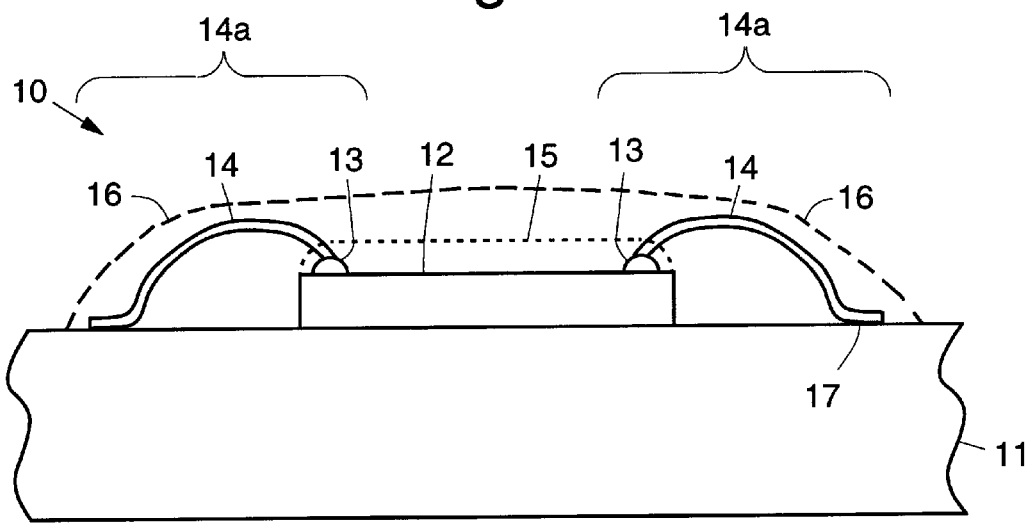
FIG. 1 shows a chip-on-board module encapsulated using the present invention.

Referring to FIG. 1, it shows a chip-on-board module 10 that is encapsulated using the present invention. The chip-on-board module 10 comprises a substrate 11 and an integrated circuit 12 disposed thereon. The integrated circuit 12 has bond pads 13 disposed thereon that are connected to the substrate 11 by way of wire bonds 14.

Figure 2:
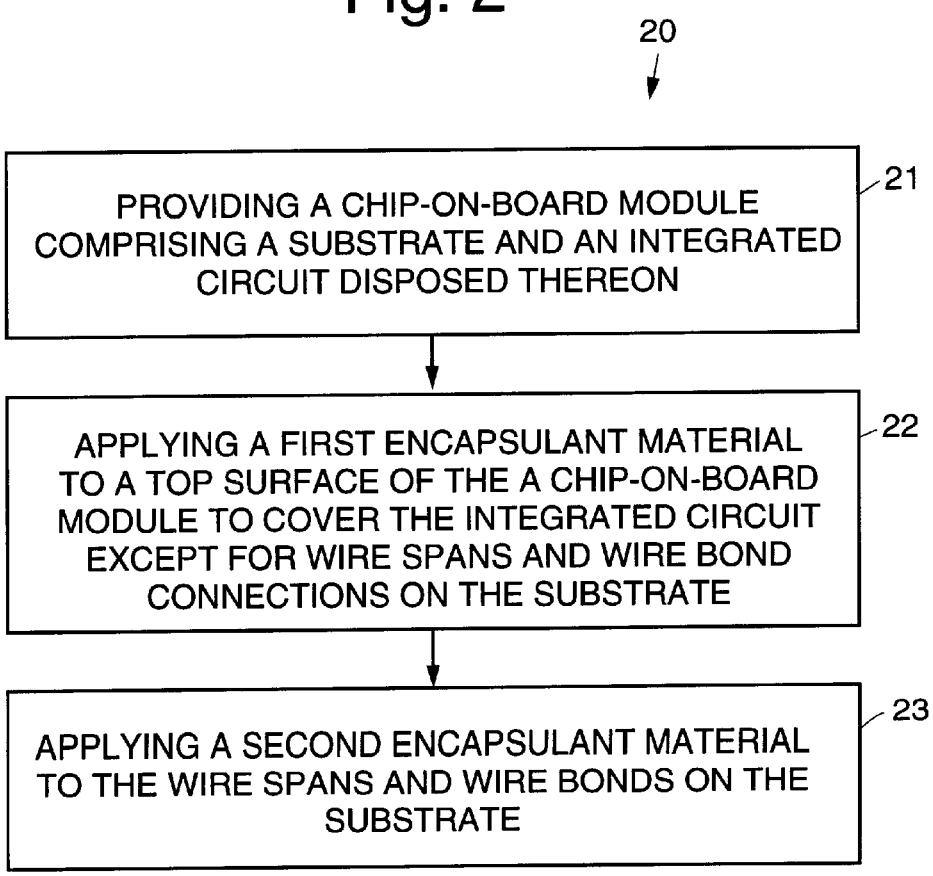
FIG. 2 is a flow diagram illustrating a method of encapsulating a chip-on-board module in accordance with the principles of the present invention.

FIG. 2 is a flow diagram illustrating a method 20 of encapsulating the chip-on-board module 10 in accordance with the principles of the present invention. Referring to FIGS. 1 and 2, the present method 20 is used to encapsulate a hybrid or the chip-on-board module 10. The method 20 comprises the steps of providing 21 a chip-on-board module 10 having a substrate 11 and an integrated circuit 12 disposed thereon, applying 22 a first encapsulant material 15 to a top surface of the a chip-on-board module 10 to cover the integrated circuit 12 and the wire bond pads 13 on the integrated circuit except for wire bond spans 14a and wire bonds 17 on the substrate 11, and applying 23 a second encapsulant material 16 to the wire bond spans 14a and wire bonds 17 on the substrate 11, and the rest of the substrate 11.

The first encapsulant material 15 may be epoxy or polyimide, for example. The second encapsulant material 16 comprises may be parylene or silicon nitride, for example. The second encapsulant material 16 may be readily removed by oxygen plasma etching, for example. The use of oxygen plasma etching does not affect the underlying first encapsulant material 15, and is removed without damaging the integrated circuit or circuits of the module 10.

The present method 20 provides an alternative and less expensive procedure for protecting integrated circuits and chip-on-board modules 10 than using a hermetic package enclosure or by using conventional glob top methods. While epoxy is a very effective barrier to moisture induced corrosion and damage resulting from physical handling, it cannot be easily removed from fully encapsulated modules 10. Consequently, the present encapsulation method 20 applies epoxy, polyimide, or similar encapsulant only to the most corrosion susceptible areas of a hybrid or multichip chip-on-board module 10. The present method 20 covers the top of the integrated circuit 11 with the first encapsulant material 15, but the encapsulant material 15 is not applied to the spans 14a of the wire bonds 14 or to wire bond connections 17 at the substrate 11, as it normally is with traditional glob top encapsulation methods. The areas not covered by the first encapsulant material 15 (typically gold wires and gold substrate traces) are coated with a more easily removed protectant or encapsulant material 17, such as parylene or silicon nitride, for example.

A major benefit of the present invention is that it allows the integrated circuits 11 of the module 10 to be removed and replaced, unlike the typical glob top approach. A typical glob topped die is not reworkable because epoxy is almost impossible to remove without ruining the underlying substrate 11 and/or wire bond pads 13, 14. The ability to rework modules 10 is especially important for today's multichip modules 10 that are relatively expensive due to the complexity and cost of the integrated circuits 12 and substrate 11.

The present invention may be advantageously use to produce chip-on-board modules 10 used in radar and space communications systems, electro-optical systems, and weapons systems, for example. The present chip-on-board processing method 20 may be used in commercial applications such as automotive applications where rework of encapsulated devices is required.

The present chip-on-board processing method 20 is a technology that eliminates hermetic packages, thus providing for lower cost modules, increases packaging density and reduces weight which also enhances performance and lowers costs, while maintaining a reworkable and repairable module 10. The present invention also displaces the aforementioned typical glob top encapsulation approach, which is known to be virtually nonreworkable. The present chip-on-board processing method 20 also displaces hermetic packaging enclosures, and can also be used in place of (or complementary to) sealed chip-on-board technology (SCOB). Protecting circuitry by the use of hermetic packages or sealed chip-on-board processes is more expensive than the present top of die encapsulation method 20.

Thus, a top of die processing method that provides encapsulation on the top of a chip-on-board module to permit rework of the module and removal of integrated circuits thereof has been disclosed. It is to be understood that the described embodiments are merely illustrative of some of the many specific embodiments which represent applications of the principles of the present invention. Clearly, numerous and varied other arrangements may be readily devised by those skilled in the art without departing from the scope of the invention.

What is claimed is:

1. A method of encapsulating a chip-on-board module comprising a substrate and an integrated circuit disposed thereon and wire bonds connecting the integrated circuit to the substrate, said method comprising the steps of:

providing a chip-on-board module;

applying a first encapsulant material to a top surface of the chip-on-board module to cover the integrated circuit and wire bonds on the integrated circuit except for wire bond spans and wire bonds on the substrate wherein the first encapsulant material comprises a material which may not be subsequently readily removed without damaging the integrated circuit or substrate; and applying a second encapsulant material to the wire bond spans and wire bonds on the substrate wherein the second encapsulant material comprises a material which may be subsequently readily removed without affecting the first encapsulant material to thereby enable rework of the chip-on-board module.

2. The method of claim 1 wherein the step of applying the first encapsulant material comprises applying epoxy to the top surface of the a chip-on-board module.

3. The method of claim 1 wherein the step of applying the first encapsulant material comprises applying polyimide to the top surface of the a chip-on-board module.

4. The method of claim 1 wherein the step of applying the second encapsulant material comprises applying parylene to the wire bond spans and wire bonds on the substrate.

5. The method of claim 1 wherein the step of applying the second encapsulant material comprises applying silicon nitride to the wire bond spans and wire bonds on the substrate.

* * * * *